United States Patent
Srivastava et al.

(10) Patent No.: US 9,328,878 B2
(45) Date of Patent: May 3, 2016

(54) PHOSPHOR COMPOSITIONS AND LIGHTING APPARATUS THEREOF

(71) Applicant: General Electric Company, Schenectady, NY (US)

(72) Inventors: Alok Mani Srivastava, Niskayuna, NY (US); William Winder Beers, Chesterland, OH (US); William Erwin Cohen, Cleveland, OH (US); Holly Ann Comanzo, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 140 days.

(21) Appl. No.: 14/322,076

(22) Filed: Jul. 2, 2014

(65) Prior Publication Data

US 2016/0003423 A1   Jan. 7, 2016

(51) Int. Cl.
C09K 11/78 (2006.01)
F21K 99/00 (2016.01)
C09K 11/77 (2006.01)
C09K 11/61 (2006.01)

(52) U.S. Cl.
CPC ........... *F21K 9/56* (2013.01); *C09K 11/617* (2013.01); *C09K 11/774* (2013.01); *C09K 11/7728* (2013.01)

(58) Field of Classification Search
CPC .................................................. C09K 11/774
USPC ................................................. 252/301.4 R
See application file for complete search history.

(56) References Cited

U.S. PATENT DOCUMENTS

| | | |
|---|---|---|
| 5,043,308 A | 8/1991 | Luetkens, Jr. et al. |
| 7,573,072 B2 | 8/2009 | Setlur et al. |
| 7,575,697 B2 | 8/2009 | Li et al. |
| 7,586,128 B2 | 9/2009 | Sumitani |
| 8,147,717 B2 | 4/2012 | Ogawara et al. |
| 8,274,215 B2 | 9/2012 | Liu et al. |
| 8,384,092 B2 | 2/2013 | Murazaki et al. |
| 8,546,845 B2 | 10/2013 | Schmidt et al. |
| 2009/0236970 A1* | 9/2009 | Liu et al. ............... 313/503 |
| 2011/0299008 A1 | 12/2011 | Winkler et al. |
| 2015/0275079 A1 | 10/2015 | Petry et al. |

FOREIGN PATENT DOCUMENTS

| | | |
|---|---|---|
| DE | 102012021570 A1 | 5/2014 |
| EP | 2180032 A2 | 4/2010 |
| JP | 2013077825 A | 4/2013 |

OTHER PUBLICATIONS

Jagannathan et al., "Eu<2+> Luminscence in MAl3B07 Aluminoborates (M=Ca, Sr, Ba)", Materials Research Bullettin, vol. 27, Issue No. 4, pp. 459-466, Apr. 1, 1992.

(Continued)

*Primary Examiner* — Nimeshkumar Patel
*Assistant Examiner* — Christopher Raabe
(74) *Attorney, Agent, or Firm* — Mary Louise Stanford

(57) ABSTRACT

A green emitting phosphor composition is disclosed. A phosphor composition of formula $Ca_{1-x}Eu_xAlB_3O_7$, where $0<x<0.5$ is formed from combining calcium carbonate, boron oxide, aluminum oxide, and europium oxide; and then firing the combination. A lighting apparatus including the phosphor composition is also provided. The phosphor composition may be combined with an additional phosphor to generate white light.

24 Claims, 2 Drawing Sheets

(56) References Cited

OTHER PUBLICATIONS

Liu et al., "A Study on the Luminescence Properties of CaAlBO[Sub 4]: RE[Sup 3+] (RE=Ce, Tb and Eu) Phosphors", Journal of the Electrochemical Society, vol. 155, Issue No. 9, pp. J252-J255, Jul. 25, 2008.

Zheng et al., "A study on the Luminescence Properties of CaAl2B2O7:Eu2+ Phosphor", Physica B: Condensed Matter, vol. 406, Issue No. 4, pp. 996-999, Dec. 25, 2010.

Palaspagar et al., "Combustion Synthesis and Photoluminescence properties of a novel Eu3+doped Lithium Alumino-Borate Phosphor", Journal of Luminescence, vol. 154, pp. 58-61, Apr. 18, 2014.

PCT Search Report and Written Opinion issued in connection with corresponding PCT Application No. PCT/US2015/037362 on Oct. 6, 2015.

Guo et al.,"Green-emitting phosphor Na2Gd2B2O7:Ce3+, Tb3+ for near-UV LEDs", Journal of the chemical science, RSC Advances, Sep. 28, 2011, Issue 5, 4 Pages, 2012.

* cited by examiner

PHOSPHOR COMPOSITIONS AND LIGHTING APPARATUS THEREOF

BACKGROUND

The invention relates generally to green emitting phosphors applicable to lighting systems. More particularly, the invention relates to green-emitting phosphors for solid state lighting systems, and a lighting apparatus employing these phosphors and blends thereof.

Generation of "white light" is currently achieved by so called "white LEDs" that are constituted by employing a blue LED in conjunction with a yellow-green emitting, cerium-doped yttrium aluminum garnet known as "YAG," having the formula $Y_3Al_5O_{12}:Ce^{3+}$. YAG has been historically used in these lighting systems because of the high quantum efficiency under blue light excitation and a broad emission spectrum that peaks in the yellow spectral region. The drawback of YAG based lighting systems is the relatively poor color rendering properties and high color temperature. For example, when an object is illuminated under such currently used white LEDs, they cannot imitate the colors illuminated by natural light.

Although numerous phosphors have been proposed in the past several years, the range of phosphors that are suitable for LEDs is limited. Therefore, there is a need for new green-emitting phosphors that produce improved color rendering in white light emitting solid state lighting systems.

BRIEF DESCRIPTION

Briefly, most of the embodiments of the present invention provide a phosphor composition derived from combining about 36 parts by weight of calcium carbonate, about 40 parts by weight of boron oxide, about 20 parts by weight of aluminum oxide, and about 3 parts by weight of europium oxide; and then firing the combination.

In one embodiment, a phosphor composition of formula $Ca_{1-x}Eu_xAlB_3O_7$, where $0<x<0.5$ is provided. The composition is formed by combining calcium carbonate, boron oxide, aluminum oxide and europium oxide; and firing the combination.

Some embodiments relate to a lighting apparatus. The lighting apparatus includes a light source; and a phosphor material radiationally coupled to the light source. The phosphor material is derived from combining about 36 parts by weight of calcium carbonate, about 40 parts by weight of boron oxide, about 20 parts by weight of aluminum oxide, and about 3 parts by weight of europium oxide; and then firing the combination.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
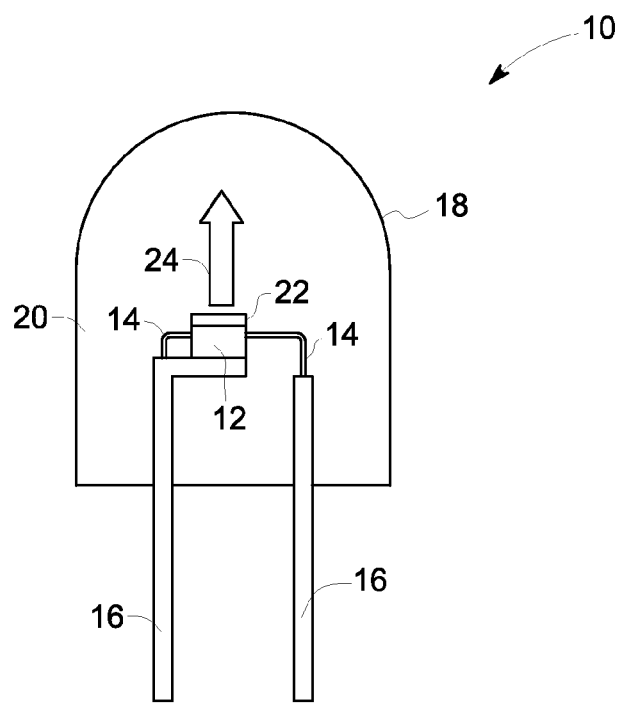
FIG. 1 is a schematic cross sectional view of a lighting apparatus according with one embodiment of the invention.
Figure 2:
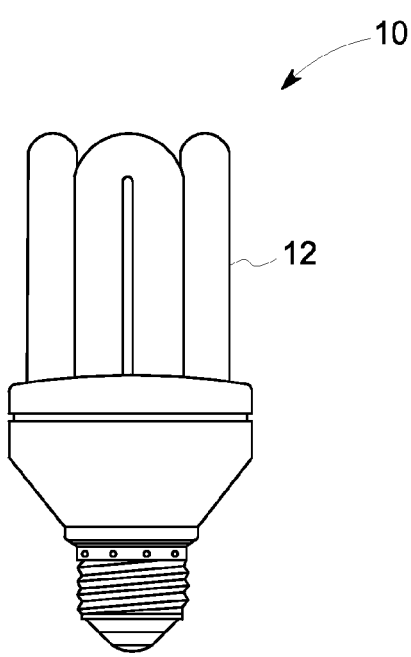
FIG. 2 is a schematic cross sectional view of a lighting apparatus, in accordance with another embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

In the following specification and the claims that follow, the singular forms "a", "an" and "the" include plural referents unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

As used herein, the term "phosphor" or "phosphor material" or "phosphor composition" may be used to denote both a single phosphor composition as well as a blend of two or more phosphor compositions. As used herein, the term "lamp" or "lighting apparatus" or "lighting system" refers to any source of visible and/or ultraviolet light which can be generated by at least one light emitting element producing a light emission when energized, for example a phosphor material, a light emitting diode.

The terms "substitution" and "doping" refer to adding an amount of an element in a material. Typically, an element in a material is partially or fully replaced by another element on such addition. It should be noted that phosphors described herein may be written down as $CaAlB_3O_7:Eu^{2+}$. As understood by those skilled in the art, this type of notation means that the phosphor includes the composition $Ca_{1-x}Eu_xAlB_3O_7$, where x can vary from 0.0 to 0.5.

Particular application is described, herein, in conjunction with converting LED-generated ultraviolet (UV), violet, or blue radiation into a desired color light or white light for general illumination or other purposes. It should be appreciated, however, that the invention is also applicable to the conversion of radiation from UV, violet, and/or blue lasers, as well as other light sources, to white light.

Some embodiments of the present invention are directed to a phosphor composition of formula $Ca_{1-x}Eu_xAlB_3O_7$, where $0<x<0.5$. The composition is formed by combining the constituent compounds: calcium carbonate, boron oxide, aluminum oxide and europium oxide; and firing the combination. In certain instances, x ranges from about 0.05 to about 0.1.

In first step, powders of the constituent compounds are mixed in appropriate amounts. In one embodiment, an amount of calcium carbonate ranges from about 35 parts by weight to about 40 parts by weight. In one embodiment, an amount of boron oxide ranges from about 40 parts by weight to about 45 parts by weight. In one embodiment, an amount of aluminum oxide ranges from about 18 parts by weight to about 22 parts by weight. In one embodiment, an amount of europium oxide ranges from about 2.5 parts by weight to about 4 parts by weight. Total parts by weight may be 100 parts by weight, although the total may be greater or less than 100 parts. Proportions of the raw materials with respect to the other listed raw materials are as set forth above. Mixing may include grinding by any technique known in the art.

In some embodiments, the combination or mixture is formed by combining about 36 parts by weight of calcium carbonate, about 40 parts by weight of boron oxide, about 20 parts by weight of aluminum oxide, and about 3 parts by weight of europium oxide.

In next step, the mixture formed in the first step is fired at a high temperature under a reducing atmosphere. The firing may include heating at a high temperature for a few minutes or to a few hours. In one embodiment, the firing is carried out in a reducing environment, at a temperature less than about 1000 degrees Celsius. In some embodiments, the firing temperature may range from about 500 degrees Celsius to about 1000 degrees Celsius.

The reducing environment is a nitrogen-containing atmosphere. A mixture of hydrogen and nitrogen can be used, containing from 90% by volume nitrogen up to substantially pure nitrogen. Usually, however, the reducing environment may contain from about 90% to about 99% by volume nitrogen. The firing environment may also include other inert gases such as argon etc. Although combinations of multiple gases may be utilized, consideration should be given to process design, and if the use of multiple carrier gases provides no or negligible advantage, preference in some cases may be given to the utilization of only hydrogen and nitrogen.

In some embodiments, the firing step may include one or more sub-steps, where one or more of the sub-steps may be carried out by, for example, using a different temperature or pressure and/or a different environment. The sub-steps may also include grinding the mixture in one or more of the sub-steps before firing.

In some embodiments, a phosphor composition is derived from combining about 36 parts by weight of calcium carbonate, about 40 parts by weight of boron oxide, about 20 parts by weight of aluminum oxide, and about 3 parts by weight of europium oxide; and firing the combination. The constituent compounds are first mixed, and the resulting mixture is grounded and fired under same processing conditions as discussed above. In one embodiment, the phosphor composition has a formula $Ca_{1-x}Eu_xAlB_3O_7$, where $0<x<0.5$. In certain instances, x ranges from about 0.05 to about 0.1. In one embodiment, the phosphor composition may have a substantially different formula compared to the formula $Ca_{1-x}Eu_xAlB_3O_7$, where $0<x<0.5$.

Quite generally, in the interest of brevity of the discussions herein, the phosphor compositions formed by combining calcium carbonate, boron oxide, aluminum oxide, and europium oxide as described herein, may be referred to as "CaAlB compositions" or "CaAlB phosphor" throughout the specification.

Furthermore, the phosphor composition may be additionally doped with an additional activator ion. As used herein, the term "activator ion" refers to an ion (for example $Ce^{3+}$) doped in a phosphor that forms luminescent center and is responsible for the luminescence of the phosphor. Additional activator ions may include ions of Pr, Sm, Eu, Tb, Dy, Tm, Er, Ho, Nd, Bi, Pb, Yb, Mn, Ag, Cu, or any combinations thereof.

The phosphor compositions as described in above embodiments absorb radiation in near-UV or blue region (a wavelength range between about 350 nm and about 470 nm) and emit green light. Thus, these phosphor compositions may be used in a lighting apparatus to generate light suitable for general illumination and other purposes. In some embodiments, the phosphor compositions may be used in a lighting apparatus to generate green light for applications such as toys, traffic light, backlight, etc. In some embodiments, the phosphor compositions may be used in combination with other phosphors (in a blend) to produce white light.

Figure 3:
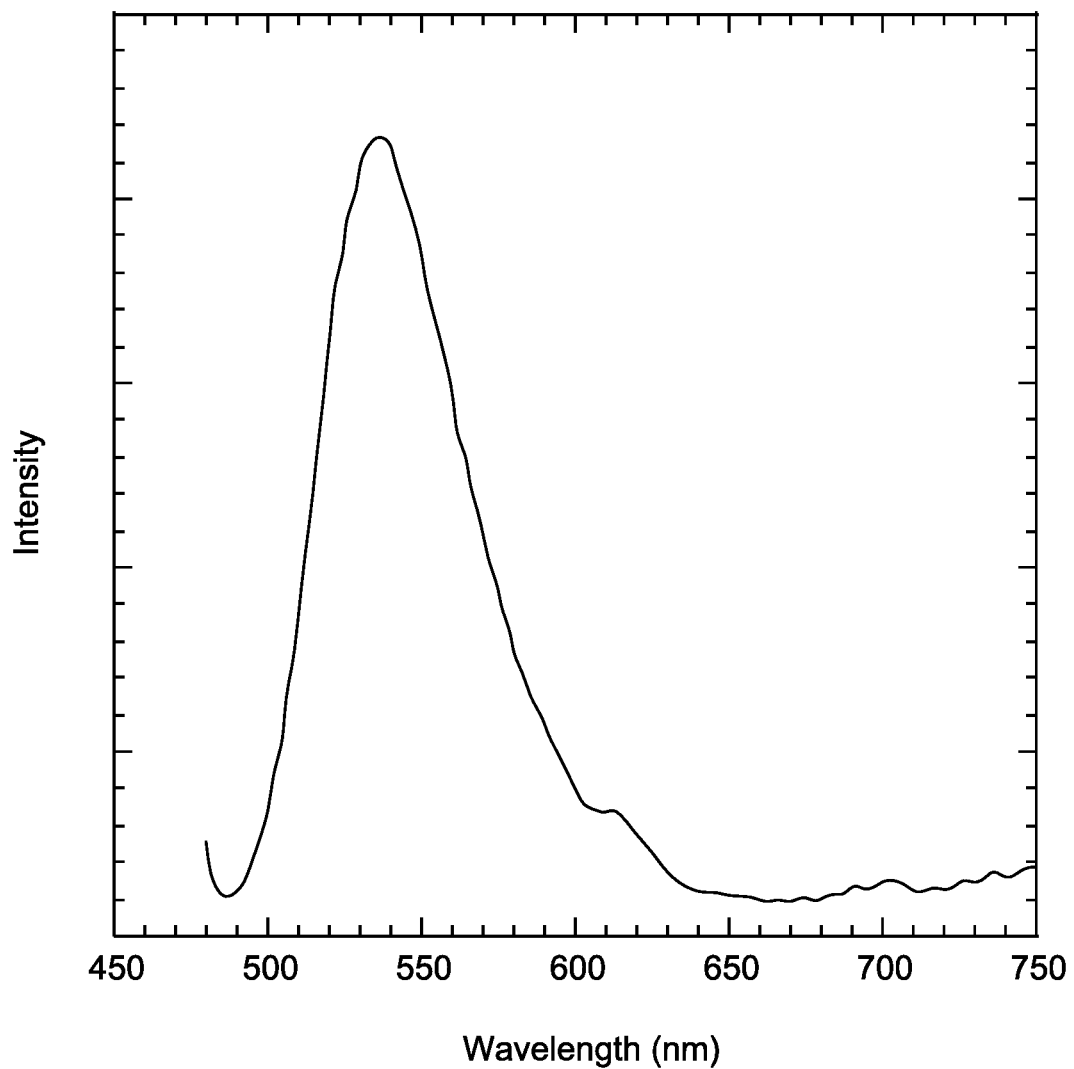
FIG. 3 shows the emission spectra of a phosphor composition using a 400 nm excitation wavelength, in accordance with an exemplary embodiment of the invention.

Advantageously, these compositions produce an emission spectrum in a relatively narrow wavelength range from about 480 nanometers to about 650 nanometers. The emission spectrum is depressed in the yellow region and shifted towards the blue region as compared to conventional garnet phosphors (for example, yttrium aluminum garnet—$Y_3Al_5O_{12}:Ce^{3+}$). In one embodiment, the peak emission of the phosphor compositions, as disclosed in the present invention, exists in a wavelength range from about 520 nanometers to about 620 nanometers. In one embodiment, the peak emission exists in a wavelength range from about 530 nanometers to about 580 nanometers. For example, FIG. 3 shows emission spectra of an exemplary composition $Ca_{0.95}Eu_{0.05}AlB_3O_7$.

As described previously, the conventional garnet phosphors (e.g., YAG) that are generally used in a lighting apparatus, produce yellow-green emission (peak emission ~580 nm). When these garnets are used in combination with red emitting phosphors in a blend to produce white light, the red-green contrast (may also be referred to as red-green separation) is not very good because of their efficient emission in yellow region.

The phosphor compositions of the present invention have the advantage of producing narrower and blue-shifted emission relative to the conventional garnet phosphors. For example, when the present green-emitting CaAlB compositions are used in combination with a red-emitting phosphor in a blend, the LED based lighting systems/devices produce white light with improved color rendering properties as compared to that are often achieved by using the conventional garnet. A deficiency in the yellow region of the present CaAlB compositions leads to increased red-green color contrast (or enhanced red-green separation) when objects are viewed under these lighting systems in comparison to white LEDs that employ conventional yellow-green garnets. In some embodiments, an improvement in red-green contrast of a blend employing the present CaAlB composition is at least about 5 percent, based on the red-green contrast of a blend including conventional garnet. In some specific embodiments, the improvement in red-green contrast is at least about 10 percent. Additionally, these blue-shifted green emission of the present CaAlB compositions provide additional advantage to color blinds when used for green light emitting devices, for example in traffic light and backlights.

Some embodiments of the invention are directed to a lighting apparatus that includes a phosphor material radiationally coupled to a light source. The phosphor material includes the phosphor composition as disclosed in above embodiments. In one embodiment, the light source can be a semiconductor radiation source, for example a light emitting diode (LED) or an organic light emitting device (OLED). Radiationally coupled means that radiation from the light source is transmitted to the phosphor material, and the phosphor emits radiation of a different wavelength. A combination of the light from the light source and the light emitted from the phosphor material may be used to produce a desired color emission or white light. For example, a white light emitting LED device may be based on a blue emitting InGaN LED chip. The blue emitting LED chip may be coated with a phosphor composition or a phosphor blend to convert some of the blue radiation to a complementary color, e.g. a green emission or a white emission.

Non-limiting examples of lighting apparatus or devices include devices for excitation by light-emitting diodes (LEDs) such as fluorescent lamps, cathode ray tubes, plasma display devices, liquid crystal displays (LCD's), UV excitation devices, such as in chromatic lamps, lamps for backlighting, liquid crystal systems, plasma screens, xenon excitation lamps, and UV excitation marking systems. These uses are meant to be merely exemplary and not exhaustive.

FIG. 1 illustrates a lighting apparatus or lamp 10 according to some embodiments of the present invention. The lamp 10 includes a light emitting diode (LED) chip 12, and leads 14 electrically attached to the LED chip. The leads 14 provide current to LED chip 12 and thus cause it to emit radiation. The LED chip 12 may be any semiconductor blue or ultraviolet light source, for example based on a nitride compound semiconductor of formula $In_iGa_jAl_kN$ (where $0 \leq i$; $0 \leq j$; $0 \leq k$ and $i+j+k=1$) having an emission wavelength greater than about 250 nm and less than about 550 nm. More particularly, the chip 12 may be a near-UV or blue emitting LED having a peak emission wavelength from about 300 nm to about 500 nm. Such LEDs are known in the art. In lighting apparatus 10, a phosphor material (as described below) is disposed on a surface of the LED chip 12, and is radiationally coupled to the chip 12. The phosphor material can be deposited on the LED 12 by any appropriate method known in the art. The light emitted by the LED chip 12 mixes with the light emitted by the phosphor material to produce desired emission (indicated by arrow 24).

Although the general discussion of the exemplary structures of the invention discussed herein are directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

With reference to FIG. 1, the LED chip 12 may be encapsulated within an envelope 18, which encloses the LED chip and an encapsulant material 20. The envelope 18 may be, for example, glass or plastic. The LED chip 12 may be enclosed by the encapsulant material 20. The encapsulant material 20 may be a low temperature glass, or a thermoplastic or thermoset polymer, or resin as known in the art, for example, a silicone or epoxy resin. In an alternate embodiment, the lamp 10 may only comprise an encapsulant without an outer envelope 18.

Various structures of the lamp 10 are known in the art. For example, in some embodiments, the phosphor material may be interspersed within the encapsulant material, instead of being disposed directly on the LED chip 12. In some other embodiments, the phosphor material may be coated onto a surface of the envelope, instead of being formed over the LED chip. Moreover, in some embodiments, the lamp may include a plurality of LED chips. These various structures discussed with respect to FIG. 1 may be combined, with the phosphor material located in any two or all three locations or in any other suitable location, such as separately from the envelop or integrated into the LED. Further, different phosphor blends may be used in different parts of the structure.

In some embodiments, the lighting apparatus can be a fluorescent lamp or a compact fluorescent lamp (CFL), in combination with a LED. For instance, a combination of a LED-generated light and a phosphor-generated light may be used to produce visible light having enhanced color contrast. In this instance, a LED can be mounted in the base of the fluorescent lamp, for example CFL lamp to add to or supplement light in select wavelength regions of the visible spectrum, such as a portion of blue region, to the light being generated by the phosphor composition coated on the glass envelope 11 of a lamp 10.

In any of the above structures, the LED based lighting apparatus 10 may also include a plurality of particles (not shown) to scatter or diffuse the emitted light. These scattering particles would generally be embedded in the encapsulant 20. The scattering particles may include, for example, particles made from $Al_2O_3$ (alumina) or $TiO_2$ (titania). The scattering particles may effectively scatter the light emitted from the LED chip 12, preferably with a negligible amount of absorption.

As alluded previously, the phosphor material may further include an additional phosphor composition to form a phosphor blend to produce white light from the lighting apparatus. In some embodiments, the phosphor blend may be applicable in a white light emitting LED lighting systems. In one embodiment, the phosphor blend includes the phosphor composition (for example, CaAlB phosphor) as described above, and an additional phosphor composition that has a peak emission in a broad wavelength range from about 590 nanometers to about 680 nanometers.

The additional phosphor may be a complex fluoride that is a line emitter and generates red light. Suitable examples include complex fluorides doped with $Mn^{4+}$, for example $(Na, K, Rb, Cs, NH_4)_2[(Ti, Ge, Sn, Si, Zr, Hf)F_6]:Mn^{4+}$ and the like. In certain instances, a complex fluoride doped with $Mn^{4+}$ is $K_2[SiF_6]:Mn^{4+}$ ("PFS"). Other non-limiting examples are red emitting nitride/oxynitride phopshors activated with divalent europium ($Eu^{2+}$).

The phosphors listed above are not intended to be limiting. Any other phosphors, commercial and non-commercial, that form non-reactive blends with the phosphor compositions of the present invention may be used in blends, and are considered within the scope of the present techniques. Furthermore, some additional phosphors may be used, e.g., those emitting throughout the visible spectrum region, at wavelengths substantially different from those of the phosphors described herein. These additional phosphors may be used in the blend to customize the white color of the resulting light, and to produce sources with improved light quality.

Each of the general formulas listed herein is independent of every other general formula listed. Specifically, x, y, z, and other variables that may be used as numeric placeholders in a formula are not related to any usage of x, y, z and other variables that may be found in other formulas or compositions.

When the phosphor material includes a blend of two or more phosphors, the ratio of each of the individual phosphors in the phosphor blend may vary, depending on the characteristics of the desired light output, for example color temperature. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%.

The phosphors used to make phosphor blends, may be produced by mixing powders of the constituent compounds and then firing the mixture under a reducing atmosphere or by any technique known in the art. As known to those skilled in the art, the relative proportions of each phosphor in the phosphor blends may be adjusted, so that when their emissions are blended and employed in a lighting device or apparatus, there is produced visible light of predetermined ccx and ccy values on the CIE (International Commission on Illumination) chromaticity diagram. As stated, a white light is preferably produced.

By assigning appropriate spectral weights for each phosphor, one can create spectral blends to cover the relevant portions of color space for white lamps. Specific examples of this are shown below. For various desired CCT's, CRI's and color points, one can determine the appropriate amounts of each phosphor to include in the blend. Thus, one can customize phosphor blends to produce almost any CCT or color point, with corresponding acceptable CRI.

By use of the present invention, particularly the blends described herein, lamps can be provided having high red-green contrast, high luminosity and acceptable CRI values, for a low range of color temperatures of interest (2500 K to 4000 K) for general illumination. Table 2 shows luminosity and CRI values of an exemplary blend.

EXAMPLES

The examples that follow are merely illustrative, and should not be construed to be any sort of limitation on the scope of the claimed invention.

Two samples, an experimental blend and a comparative blend, were prepared as listed below in Table 1. The emission spectra of individual phosphors were obtained, and used in calculations to predict emission spectra for the blends presented in Table 1. FIG. 3 shows the emission spectra of $Ca_{0.98}Eu_{0.02}AlB_3O_7$. This composition has its peak emission at about 540 nanometers. The calculations also included any visible light emitted by a light source.

TABLE 1

Examples of phosphor blends produced

| Sample | Phosphor blend |
|---|---|
| Experimental blend | $Ca_{0.98}Eu_{0.02}AlB_3O_7/K_2[SiF_6]:Mn^{4+}$ |
| Comparative blend | $Y_3Al_5O_{12}:Ce^{3+}/K_2[SiF_6]:Mn^{4+}$ |

Table 2 shows spectral characteristics of the two sample blends of Table 1. The experimental blend generates white light having high red-green contrast while maintaining acceptable luminosity and CRI value at a low CCT between 2500 K and 3000 K.

TABLE 2

| Sample | Luminosity (lumen/watt) | CRI |
|---|---|---|
| Experimental blend | 318 | 64 |
| Comparative blend | 332 | 91 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phosphor composition derived from combining about 36 parts by weight of calcium carbonate, about 40 parts by weight of boron oxide, about 20 parts by weight of aluminum oxide, and about 3 parts by weight of europium oxide; and firing the combination.

2. The phosphor composition of claim 1, having a general formula $(Ca_{1-x}Eu_x)AlB_3O_7$, where $0<x<0.5$.

3. The phosphor composition of claim 2, wherein $0.05 \leq x \leq 0.10$.

4. The phosphor composition of claim 1, having a peak emission in a wavelength range from about 520 nanometers to about 620 nanometers.

5. The phosphor composition of claim 1, having a peak emission in a wavelength range from about 530 nanometers to about 580 nanometers.

6. A phosphor composition of formula $Ca_{1-x}Eu_xAlB_3O_7$, where $0<x<0.5$ formed by:

combining calcium carbonate, boron oxide, aluminum oxide and europium oxide; and
firing the combination.

7. The phosphor composition of claim 6, wherein an amount of calcium carbonate ranges from about 35 parts by weight to about 40 parts by weight.

8. The phosphor composition of claim 6, wherein an amount of boron oxide ranges from about 40 parts by weight to about 45 parts by weight.

9. The phosphor composition of claim 6, wherein an amount of aluminum oxide ranges from about 18 parts by weight to about 22 parts by weight.

10. The phosphor composition of claim 6, wherein an amount of europium oxide ranges from about 2.5 parts by weight to about 4 parts by weight.

11. The phosphor composition of claim 6, wherein firing is carried out at a temperature in a range from about 500 degrees Celsius to about 1000 degrees Celsius.

12. The phosphor composition of claim 6, wherein firing is carried out in a nitrogen-containing environment.

13. The phosphor composition of claim 6, having a peak emission in a wavelength range from about 520 nanometers to about 620 nanometers.

14. The phosphor composition of claim 6, having a peak emission in a wavelength range from about 530 nanometers to about 580 nanometers.

15. A lighting apparatus comprising a light source and a phosphor material radiationally coupled to the light source, the phosphor material comprising a phosphor composition derived from combining about 36 parts by weight of calcium carbonate, about 40 parts by weight of boron oxide, about 20 parts by weight of aluminum oxide, and about 3 parts by weight of europium oxide and firing the combination.

16. The lighting apparatus of claim 15, wherein the phosphor composition has a general formula $(Ca_{1-x}Eu_x)AlB_3O_7$, where $0<x<0.5$.

17. The lighting apparatus of claim 16, wherein $0.05 \leq x \leq 0.10$.

18. The lighting apparatus of claim 15, wherein the phosphor composition has a peak emission in a wavelength range from about 520 nanometers to about 620 nanometers.

19. The lighting apparatus of claim 15, wherein the phosphor material comprises an additional phosphor composition.

20. The lighting apparatus of claim 19, wherein the additional phosphor composition has a peak emission in a wavelength range from about 590 nanometers to about 650 nanometers.

21. The lighting apparatus of claim 20, wherein the additional phosphor composition comprises $(Na, K, Rb, Cs, NH_4)_2[(Ti, Ge, Sn, Si, Zr, Hf)F_6]:Mn^{4+}$.

22. The lighting apparatus of claim 15, wherein the phosphor material comprises the phosphor composition of formula $(Ca_{1-x}Eu_x)AlB_3O_7$, where $0<x<0.5$ in a spectral weight from about 1 percent to about 70 percent.

23. The lighting apparatus of claim 15, wherein the light source comprises a light emitting diode (LED) device.

24. The lighting apparatus of claim 15, wherein the phosphor material comprises a phosphor composition of formula $(Ca_{1-x}Eu_x)AlB_3O_7$, where $0<x<0.5$, and a red emitting phosphor composition of formula $(Na, K, Rb, Cs, NH_4)_2[(Ti, Ge, Sn, Si, Zr, Hf)F_6]:Mn^{4+}$.

* * * * *